United States Patent
Zhang et al.

(10) Patent No.: US 6,641,767 B2
(45) Date of Patent: Nov. 4, 2003

(54) METHODS FOR REPLICATION, REPLICATED ARTICLES, AND REPLICATION TOOLS

(75) Inventors: Haiyan Zhang, Woodbury, MN (US); Gerald M. Benson, Woodbury, MN (US)

(73) Assignee: 3M Innovative Properties Company, St. Paul, MN (US)

(*) Notice: Subject to any disclaimer, the term of this patent is extended or adjusted under 35 U.S.C. 154(b) by 0 days.

(21) Appl. No.: 09/522,388

(22) Filed: Mar. 10, 2000

(65) Prior Publication Data

US 2003/0157347 A1 Aug. 21, 2003

(51) Int. Cl.⁷ .................. B29C 33/38; C23C 16/00; C25D 1/00
(52) U.S. Cl. .................. 264/220; 205/67; 264/219; 264/293; 264/299; 264/328.1; 427/248.1
(58) Field of Search .................. 264/219, 220, 264/293, 328.1, 299; 427/248.1; 205/67

(56) References Cited

U.S. PATENT DOCUMENTS

| | | | |
|---|---|---|---|
| 4,948,627 A | * | 8/1990 | Hata et al. .................. 427/38 |
| 5,077,870 A | | 1/1992 | Melbye et al. |
| 5,156,863 A | * | 10/1992 | Pricone et al. .................. 425/363 |
| 5,223,350 A | * | 6/1993 | Kobayashi et al. .................. 428/697 |
| 5,280,084 A | | 1/1994 | Paul |
| 5,437,894 A | | 8/1995 | Ogawa et al. |
| 5,514,424 A | | 5/1996 | Morra et al. |
| 5,518,780 A | | 5/1996 | Tamor et al. |
| 5,674,592 A | | 10/1997 | Clark et al. |
| 5,693,236 A | | 12/1997 | Okumura et al. |
| 5,728,446 A | | 3/1998 | Johnston et al. |
| 5,759,230 A | | 6/1998 | Chow et al. |
| 5,766,784 A | | 6/1998 | Baskaran et al. |
| 5,932,299 A | | 8/1999 | Katoot |
| 5,976,686 A | | 11/1999 | Kaytor et al. |
| 6,136,243 A | * | 10/2000 | Mehregany et al. .................. 264/162 |
| 6,385,997 B1 | * | 5/2002 | Nelson et al. .................. 65/64 |

FOREIGN PATENT DOCUMENTS

| | | |
|---|---|---|
| EP | 1 016 637 A2 | 1/1987 |
| EP | 0 666 338 | 8/1995 |
| EP | 0 748 775 | 12/1996 |
| EP | 0 933 388 | 8/1999 |
| WO | PCT/EP95/02934 | 2/1996 |
| WO | WO 97/31357 | 8/1997 |
| WO | WO 98/39673 | 9/1998 |

OTHER PUBLICATIONS

Gombert, A., "Subwavelength–structured antireflective surfaces on glass", Thin Solid Films, 351, 1999, pp. 73–78.

(List continued on next page.)

*Primary Examiner*—Allan R. Kuhns
(74) *Attorney, Agent, or Firm*—Robert J. Pechman

(57) ABSTRACT

A method of replicating a structured surface that includes providing a tool having a structured surface having a surface morphology of a crystallized vapor deposited material; and replicating the structured surface of the tool to form a replicated article. A replicated article includes at least one replicated surface, wherein the replicated surface includes a replica of a crystallized vapor deposited material. A replication tool includes: a tool body that includes a tooling surface; and a structured surface on the tooling surface, wherein the structured surface includes crystallized vapor deposited material or a replica of crystallized vapor deposited material.

19 Claims, 4 Drawing Sheets

OTHER PUBLICATIONS

Physical Chemistry of Surfaces, $6^{th}$ Ed., John Wiley & Sons, Inc., New York, 1997, A.W. Adamson and A.P. Gast.

Langmuir, 12, 9, May 1, 1996, *Super–Water–Repellent Fractal Surfaces*, T. Onda, S. Shibuichi, N. Satoh, and K. Tsujii.

Materials Science Research Inernational, 3, 3, 195–0189, 1997, *A Study On Ice Adhesiveness To Water–Repellent Coating*, H. Saito, K. Takai, G. Yamauchi.

The Chemical Society of Japan, 12, 1998, *Preparation of Super Water–Repellent Coating Films and Their Surface Morphology*, Misuyoshi Shouji, Hiroshi Sasaki and Ken'ichi Sawashima.

Surface Coatings International, 4, 1997, *Water– and Ice–Repellent Coatings*, H. Saito, K. Takai, and G. Yamauchi.

Journal of The Chemical Society, 57, 748–753, 1890 *Transactions*, L. Mond.

A.I.Ch. E. Journal, vol. 13, 86–91, Jan. 1967, *Kinetics of the Heterogeneous Decomposition of Nickel Tetracarbonyl*, H.E. Carlton and J.H. Oxley.

Disc. Faraday Soc., 3, 11–16, Jan., 1948, *Contact Angles*, A.B.D. Cassie.

Industrial and Engineering Chemistry, 28, 988–994, *Resistance of Solid Surfaces to Wetting By Water*, R.N. Wenzel (1936).

J. Colloid Interface Sci., 53, 2, 235–248, Jul. 1975, *Thermodynamics of Contact Angles*, A.W. Neumann.

\* cited by examiner

METHODS FOR REPLICATION, REPLICATED ARTICLES, AND REPLICATION TOOLS

BACKGROUND OF THE INVENTION

Replication tooling has been produced by several different techniques. These techniques include, for instance, machining and lithographic processing. Machining is accomplished by cutting with a stylus or microdrilling into a substrate. Devices which accomplish such machining are either manually, mechanically, or electronically controlled. These devices are capable of producing surfaces with optical grade precision, depending upon their quality. Examples of such devices include a diamond stylus and a microdrill.

Another method for the production of structured tooling relates to the use of sharpened or shaped structures, such as pins or rods, being forced into a relatively soft medium. For example, a traditional, multi-step approach to the production of a replication molding or tooling involves the preparation of a primary negative mold by forcing the structures into a relatively soft medium. Intermediate positive master molds are made from the negative primary mold and are then joined together to form a large positive mold. A large negative mold is then produced from the large positive mold, which is then used to produce replicated articles.

Mechanical methods are effective and economical for many kinds of structure generation. However, they can be expensive and time-consuming for the generation of very small structures.

Lasers have been used to machine some finished articles, including molds or replication toolings. Other methods include UV, X-ray, and electronic beam lithography. Usually, these methods are expensive when small structures with high resolution need to be produced. Some of them have the limitation that only small sample sizes can be produced.

Some replication applications require optical quality surfaces, which necessitates the use of costly production devices. However, there is a growing number of applications that do not require optical quality tooling since a precisely manufactured article surface is not required.

SUMMARY OF THE INVENTION

The present invention provides methods for replicating a structured surface. In one embodiment, a method includes: providing a tool that includes a structured surface having a surface morphology of a crystallized vapor deposited material; and replicating the structured surface of the tool to form a replicated article. As used herein, a "replicated article" is separable from the tool, preferably substantially in tact such that if desired it can become a tool for further replication, although it need not be further replicated. Preferably, the method further includes separating the replicated article and the tool.

In one embodiment, the structured surface of the tool includes the crystallized vapor deposited material itself, whereas in an alternative embodiment the structured surface of the tool includes a replica of the crystallized vapor deposited material. In another embodiment, the tool consists essentially of the crystallized vapor deposited material, whereas in an alternative embodiment the tool includes a substrate on which is disposed the crystallized vapor deposited material or a replica of the crystallized vapor deposited material.

In yet another embodiment, the step of providing a tool includes: providing a substrate that includes a surface; and depositing a material on the surface of the substrate using a vapor deposition technique to form a tool that includes a structured surface having a crystallized vapor deposited material on the substrate. The vapor deposition technique can be a chemical or a physical vapor deposition technique, for example, although a chemical vapor deposition technique is preferred. The substrate can be any of a wide variety of substrates, including planar substrates, such as sheet materials, or cylindrical substrates, for example. The surface of the substrate may be nonplanar, including other microstructures or macrostructures.

In still another embodiment, the step of providing a tool includes: providing a substrate that includes a surface; depositing a material on the surface of the substrate using a vapor deposition technique to form a crystallized vapor deposited material; and separating the crystallized vapor deposited material from the substrate surface to form the tool. Preferably, the vapor deposition technique is a chemical vapor deposition technique.

As used herein, the phrase "surface morphology of a crystallized vapor deposited material" means that the shapes and sizes of the structures result directly from the crystallization process (i.e., they are formed from crystallization of the vapor deposited material), thereby forming a master tool, or as a result of replicating another surface from a master tool, for example. This morphology typically includes randomly positioned structures having sizes that vary over a wide range to include both nanostructures (e.g., those on a nano-scale) and microstructures (e.g., those on a micro-scale), preferably having a substantially continuous distribution. Generally, the range of sizes depends on the deposition method and the conditions for deposition (e.g., the rate and time of deposition). Preferably, the structured surface includes randomly positioned structures having an average size (i.e., the average of the longest dimension of the base of a structure, such as a diameter of a circular base) of at least about 10 nanometers (nm), and an average spatial distance between two adjacent structures of at least about 10 nm. Preferably, the structured surface includes randomly positioned structures having an average size of no greater than about 50,000 nm, and an average spatial distance between two adjacent structures of no greater than about 50,000 nm. The tool can be made using a substrate that has macrostructures (or microstructures) prior to vapor depositing. The resultant tool has structures on structures (e.g., microstructures on macrostructures).

The tool can be replicated using a wide variety of techniques. These include, for example: casting a curable composition on the structured surface of the tool and at least partially curing the composition on the structured surface of the tool; embossing the article with the structured surface of the tool; injection molding a polymeric material onto the structured surface of the tool; extruding a material onto the structured surface of the tool and hardening the material on the tool; electroforming a material onto the structured surface of the tool; or vapor depositing a second material onto the structured surface of the tool.

As stated above, the replicated article can be used as a tool for further replication, if desired. The replicated article can have a surface that is the negative of the surface of the tool, or it can have one surface that is the negative of the surface of the tool and another surface that is the positive of the surface of the tool. The positive or negative replica of the surface can be used as the surface of the replicated article that can be further replicated. The replicated article optionally can be physically deformed before using it as a tool for further replication. It can also be treated, as with a fluorochemical, for example, before being used as a tool for further replication.

In a preferred method of replicating a structured surface, the method includes: providing a substrate; chemical vapor depositing a material that includes a metal on the substrate to form a master tool having a structured surface formed from crystallization of the chemical vapor deposited material; replicating the structured surface of the master tool to form a replicated article; and separating the master tool and the replicated article. In another preferred method of replicating a structured surface, the method includes: providing a substrate; chemical vapor depositing a material that includes nickel on the substrate to form a master tool having a structured surface formed from crystallization of the chemical vapor deposited material; replicating the structured surface of the master tool to form a replicated article; and separating the master tool and the replicated article.

The methods of the present invention can be used to alter the affect of a surface on a fluid (e.g., a gas or a polar or nonpolar liquid such as water or oil). Thus, the present invention provides a method of altering the affect of a surface on a fluid. The method includes: providing a tool that includes a structured surface having a surface morphology of a crystallized vapor deposited material; providing an article having a surface; replicating the structured surface of the tool in the surface of the article to form a replicated article; and separating the tool and the replicated article, wherein the affect of the replicated surface of the article on a fluid is altered. In one preferred embodiment, the method includes: providing a tool that includes a structured surface having a surface morphology of a crystallized vapor deposited material; providing an article having a hydrophobic surface; replicating the structured surface of the tool in the hydrophobic surface to form a replicated article; and separating the tool and the replicated article, wherein the hydrophobicity of the hydrophobic surface of the replicated article is increased. In another preferred embodiment, the method includes: providing a tool that includes a structured surface having a surface morphology of a crystallized vapor deposited material; providing an article having a hydrophilic surface; replicating the structured surface of the tool in the hydrophilic surface to form a replicated article; and separating the tool and the replicated article, wherein the hydrophilicity of the hydrophilic surface of the replicated article is increased.

The present invention also provides a replicated article that includes at least one replicated surface, wherein the replicated surface includes a replica of a crystallized vapor deposited material. The replicated article can be in the form of a sheet material such as a film. Preferably, the replicated surface includes a replica of a crystallized chemical vapor deposited material or a crystallized physical vapor deposited material.

The present invention also provides a replication tool that includes: a tool body that includes a tooling surface; and a structured surface on the tooling surface, wherein the structured surface includes crystallized vapor deposited material or a replica of crystallized vapor deposited material. The tooling surface can be planar or nonplanar. The tool body can be in a variety of shapes, such as a cylinder, which is preferred for use in a continuous replication process. The crystallized vapor deposited material can be physical or chemical vapor deposited material. The tool body preferably consists essentially of the crystallized vapor deposited material, although it can be disposed on a substrate.

In a preferred embodiment, the replication tool includes: a tool body that includes a cylinder having a tooling surface; and a structured surface on the tooling surface, wherein the structured surface includes crystallized chemical vapor deposited material or a replica of crystallized chemical vapor deposited material.

DETAILED DESCRIPTION OF PREFERRED EMBODIMENTS

The present invention provides methods for replicating a structured surface, replicated articles, and replication tools. Generally, according to the present invention a tool is provided that includes a structured surface having a surface morphology of a crystallized vapor deposited material. The structured surface of the tool is replicated to form a replicated article, which is preferably separable from the tool.

Vapor deposition techniques, such as chemical vapor deposition and physical vapor deposition, provide surfaces having unique structures. These structured surfaces typically have randomly positioned structures formed from crystallization of vapor deposited material. The surface morphology formed typically includes randomly positioned structures of multiple shapes and sizes. The geometric shapes range from conical to tubular to annular to angular in shape, which may be oriented in a variety of directions. The sizes vary over a wide range, preferably having a substantially continuous distribution of sizes. Furthermore, the density of the geometric structures can vary. Typically, the areal density of the structures varies inversely with structure size.

Generally, the range of sizes depends on the deposition method and the conditions for deposition (e.g., the rate and time of deposition). Preferably, the structured surface includes randomly positioned structures having an average size (i.e., the average of the longest dimension of the base of a structure, such as a diameter of a circular base) of at least about 10 nm, and an average spatial distance between two adjacent structures of at least about 10 nm. Preferably, the structured surface includes randomly positioned structures having an average size of no greater than about 50,000 nm, and an average spatial distance between two adjacent structures of no greater than about 50,000 nm.

The thickness of the deposited material can vary as well, depending on the conditions of deposition. Typically, the thickness ranges from about 0.1 micron (micrometer) to several hundred microns. Generally, chemical vapor deposition provides thicker films with fewer stresses, which can form cracks, than does physical vapor deposition.

Figure 1:
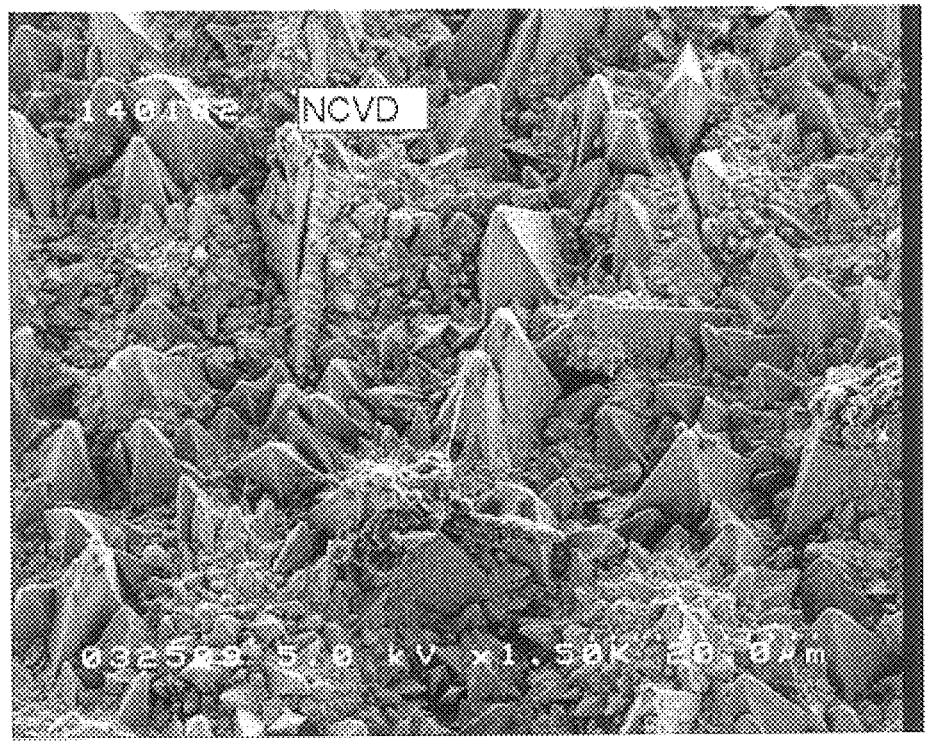
FIG. 1 is a scanning electron micrograph at 1500× magnification of a nickel surface deposited using a chemical vapor deposition process.
Figure 2:
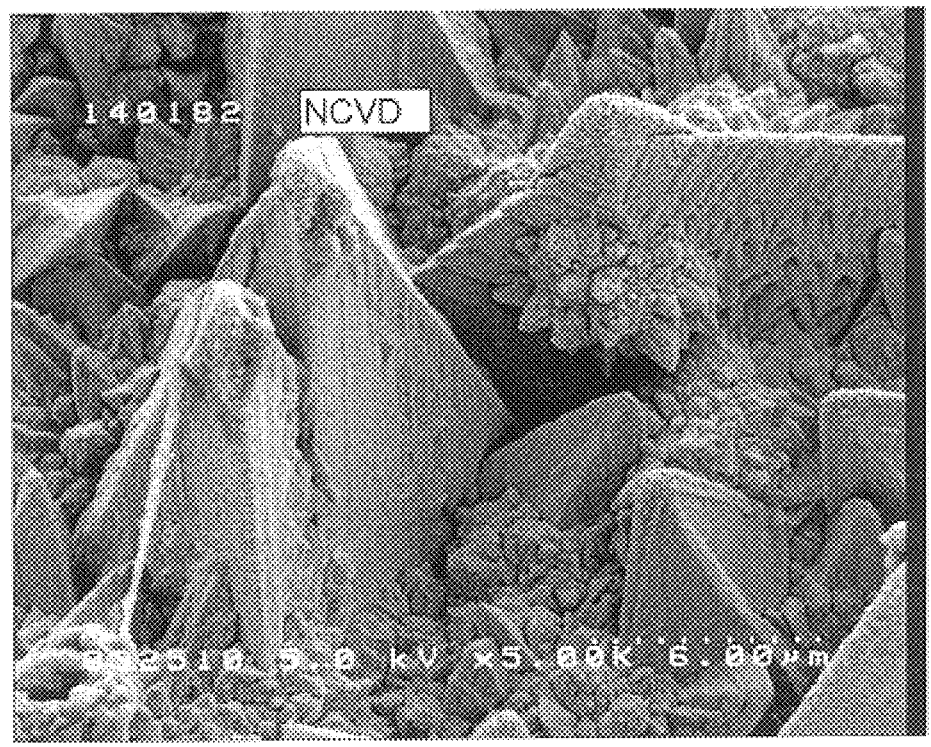
FIG. 2 is a scanning electron micrograph of the nickel surface shown in FIG. 1 at 5000×magnification.
Figure 3:
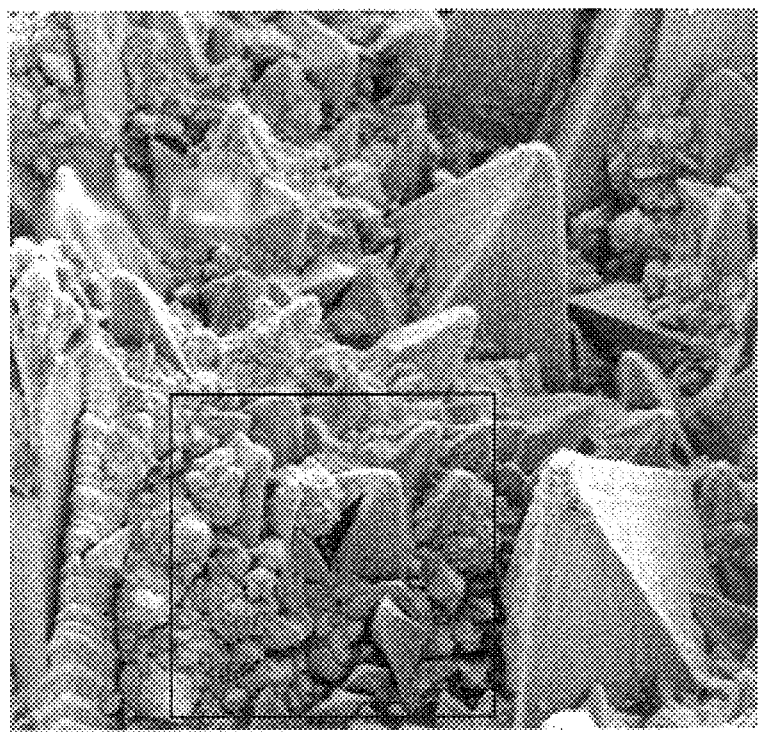
FIG. 3 is a 26×25 micron portion of the scanning electron micrograph shown in FIG. 1, which shows some fractal character.
Figure 4:
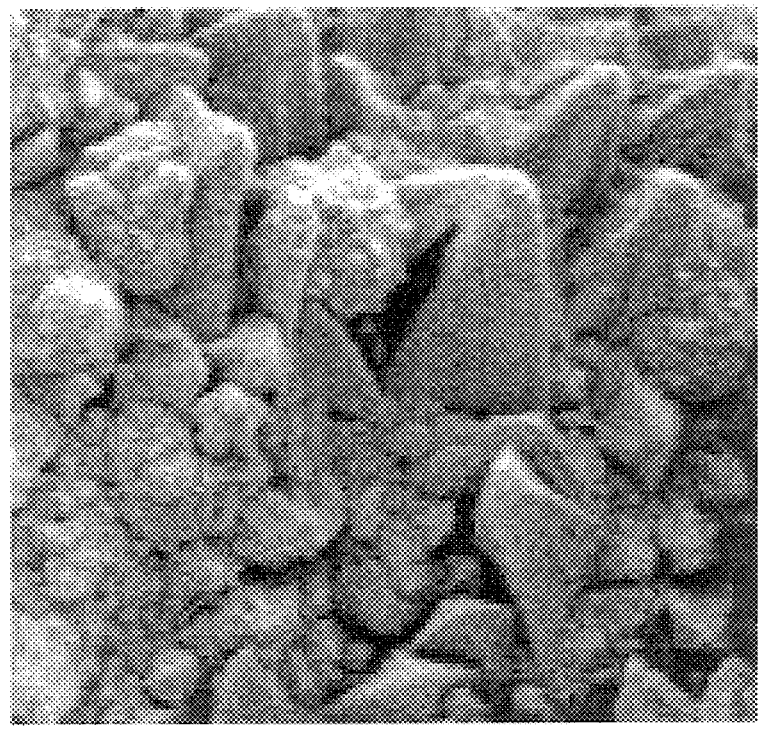
FIG. 4 is a 12×11.6 micron portion of the scanning electron micrograph shown in FIG. 3, which shows some fractal character.

An example of a surface structure formed from the chemical vapor deposition of nickel is shown in FIGS. 1 and 2. FIG. 1 shows that the randomly positioned structure has a substantially continuous distribution of sizes (e.g., about 20 microns, 10 microns, 5 microns, 2 microns, and 1 micron). In FIG. 2, it further shows that there are small structures overlapping larger ones (forming a structure-on-structure arrangement). The smaller structure having a size smaller than 50 nanometers (nm). The structure exhibits a pyramidal shape with clear facets. As shown in FIGS. 3 and 4, the surface morphology has some character (i.e., repeating physical character as a function of scale, or magnification). FIG. 3 is one portion of the surface structure formed from a nickel chemical vapor deposition process. FIG. 4 is a smaller portion of the same structure and is one part of that shown in FIG. 3.

The surface structures can be formed by a variety of vapor deposition techniques, particularly chemical vapor deposition (CVD) and physical vapor deposition (PVD). The preferred method of forming the master tooling involves chemical vapor deposition. CVD is a process wherein a stable solid reaction product nucleates and grows on a substrate in an environment where a vapor phase chemical dissociation or chemical reaction occurs, whereas PVD is a similar process where no chemical dissociation or other chemical reaction occurs. CVD uses a variety of energy sources, including heat, plasma, ultraviolet light, etc., to enable the reaction, and operates over a wide range of pressures and temperatures. CVD and PVD are techniques that have developed rapidly in recent years as a method to produce films, particularly metal films, for a variety of applications. For example, CVD and PVD coatings are used to impart oxidation-resistance, corrosion-resistance, abrasion-resistance, and reflectivity, as well as to form electrodes, electronic contacts, and other structures. To date, no one has recognized that a CVD or PVD coating can be used for surface structure generation in a replication process.

The material deposited can include a metal, metalloid, or nonmetal It can include a substantially pure metal, metalloid, or nonmetal, alloys thereof, compounds thereof, or any of such materials having dopants therein (e.g., other metals, nonmetals, or metalloids in such small amounts that an alloy or compound is typically not formed). In a preferred embodiment, the material deposited includes a metal, such as a substantially pure metal or a metal-containing compound such as a metal boride, nitride, carbide, silicide, oxide, or combinations thereof. For chemical vapor deposition, the metal is preferably selected from the group of tungsten, aluminum, copper, nickel, titanium, silver, gold, platinum, palladium, zirconium, hafnium, vanadium, niobium, tantalum, chromium, molybdenum, manganese, technetium, rhenium, iron, ruthenium, osmium, cobalt, rhodium, iridium, zinc, cadmium, tin, lead, and combinations thereof. More preferably, for chemical vapor deposition, the metal is selected from the group of nickel, copper, aluminum, tungsten, cobalt, iron, manganese, titanium, and combinations thereof, and most preferably, the metal is nickel. For physical vapor deposition, the metal is preferably selected from the group of aluminum, antimony, barium, beryllium, cadmium, calcium, chromium, cobalt, copper, germanium, gold, hafnium, indium, iridium, iron, lead, magnesium, manganese, molybdenum, nickel, niobium, osmium, palladium, platinum, rhenium, ruthenium, rhodium, silver, tantalum, technetium, tin, titanium, tungsten, uranium, vanadium, zinc, zirconium, and combinations thereof.

The structures can be formed via vapor deposition on a wide variety of materials, including metals, polymers, and other materials that can withstand the vapor deposition conditions, preferably without substantial off-gassing, thereby forming a master tool. In addition, a suitable master tool substrate is preferably durable and has good release capabilities. Such master tools or tooling articles can be used in a wide variety of replication processes. Preferably, the master tool substrate is made of a suitable material that can withstand the conditions of the desired replication process, which can include a wide range of temperatures and pressures, exposure to organic solvents and other chemicals, exposure to polymeric melts, and exposure to radiation, for example. Preferred substrates for forming the master tool include thermoplastic and elastomeric materials, as well as wood, ceramic, glass, and metallic materials. A particularly preferred substrate is metallic, such as steel, aluminum, copper, lead, nickel, and the like.

The master tool substrate can be of varying shapes and sizes, depending on the desired use of the replication master tool. For instance, the substrate may be in the form of a substantially planar plate or sheet material (e.g., film), it may be nonplanar (e.g., including undulating and pre-grooved surfaces), it may be in the form of a drum or cylinder, or it may be sheet material wrapped around a drum or cylinder. Preferably, replication master tool is an integral, single piece of material that does not need to be pieced together prior to use as a replication master mold. Also, the replication master tool may include a single layered substrate or a multi-layered substrate that includes one material or a combination of materials in layers. It is preferably a substantially continuous surface, as in a drum or cylinder. The surface of the master tool substrate may be machined with both micro features and larger, macro features easily discernible to the naked eye, prior to vapor deposition. Thus, although the vapor deposition process typically only forms microstructures, the master tool can have both microstructures (e.g., features having at least two dimensions so small as to require an optical aid, such as a scanning electron microscope, when viewed from any plane of view to determine their shapes) and macrostructures (e.g., features having at least two dimensions large enough that no optical aid is required to determine their shapes). Macrosctructures are typically on the millimeter scale or larger whereas microstructures are typically on the micrometer (or smaller) scale.

Although the structures can be formed on such substrates, the tool need not include the substrate on which the structures are initially formed. That is, the vapor deposited material can be removed from the substrate and placed on another substrate to form a tool. In certain situations, the vapor deposited material, particularly the chemical vapor deposited material, can be used as a tool without a substrate. In the latter embodiment, the tool consists essentially of the vapor deposited material.

Replicas of a master tool can also be used as tools. The material that forms the replica can be self-supporting and used without a substrate, or it can be disposed on a substrate. Substrates for such replication tools can be of the same type used in forming the initial or master tool.

The replication tool (e.g., master tool or replica thereof which can be used as a tool itself) of the present invention is particularly advantageous for manufacturing high feature density articles at a fast rate which have a large number of detailed or shaped geometric structures per given area. The method is typically economical and practical for large scale production. Also, the surface structure can be generated on a variety of materials to form a replicated article. Furthermore, many generations of tooling can be used, alternating with different materials, without sacrificing the benefit of the surface structure (i.e., integrity of the original pattern).

The replicated article is preferably separable from the tool, preferably substantially intact such that if desired it can become a tool for further replication, although it need not be further replicated. Although the replicated article can be preferably removed substantially intact, there may be some distortion of the article upon removal such that it is not an exact replica of the tool. For example, distortion can occur as a result of stretching or settling of a polymeric material as a result of incomplete cure of the material forming the replica. The replicated article can be placed on (e.g., attached to) a variety of substrates as described above for the master tool.

The surface of the articles to be replicated can be hydrophobic or hydrophilic, oleophobic or oleophilic, depending on the materials chosen. Upon replication these properties can be increased or decreased. That is, the interaction of a surface with a fluid (e.g., gases or polar or nonpolar liquids such as water and oil) can be affected upon replication of the surface using the replication tools described herein. For example, a hydrophobic surface can have increased hydrophobicity and a hydrophilic surface can have increased hydrophilicity upon replication. Preferably, the contact angle (e.g., receding and/or advancing contact angle) of a surface can be changed by at least about 25%, and more preferably by at least about 45%. In the examples described herein, it can be seen that the replica has either very high or very low contact angles when suitable materials are chosen. It has been reported how the geometry of a surface can affect the macroscopic appearance of a liquid drop on a solid surface (Cassie, *Disc. Faraday Soc.*, 3, 11 (1948); Wenzel, *Ind. Eng. Chem.*, 28, 988 (1936); and Neumann, *J. Colloid Interface Sci.*, 53, 235, (1975)). It also has been published that fractal characteristics can greatly enhance the hydrophobic or hydrophilic properties of the surface (Adamson et al., *Physical Chemistry of Surfaces*, John Wiley & Sons, Inc, New York, 1997; Onda et al., *Langmuir*, 12, 2125, (1996)). The present invention offers a unique method to generate such a surface or change in the surface properties.

One unique character of the structure generated with the present invention is that both positive and negative structures have the substantially same properties, and may be used in further replication processes. A "positive" structure is the one obtained from chemical vapor deposition (or subsequently replicated) wherein the facets of the crystal are protruding from the surface. A "negative" structure is the one obtained by replicating from the positive structure so that the facets are recessed into the surface. In Examples 4 to 6 it is shown that both positive and negative structures have substantially the same function of enhancing the hydrophobic properties.

The replication process can include a wide variety of processes, including casting, embossing, extruding, injection molding, electroforming or otherwise plating, vapor depositing, etc. Casting typically involves forming an article by casting a curable composition on the structured surface (e.g., pouring a fluid into a hole) and letting it at least partially cure. Embossing (e.g., compression molding) typically involves raising a design on a blank with dies of similar pattern, one of which becomes the negative of the other. Extruding typically involves forming an article by extruding a material (typically a liquid or other flowable material) onto the structured surface of the tool and hardening the material on the tool. Injection molding a polymeric material typically involves forming an article by forcing a liquid or other flowable material into a mold and letting it harden. Electroforming a material onto the structured surface of the tool or otherwise plating, typically involves coating a layer of metals by electrochemical means. If vapor depositing is used, one major surface of the replicated article forms an exact negative of the structured surface of the tool whereas the other major surface can have a different arrangement of randomly positioned structures.

In one example, a moldable material is applied to a first surface of the replication tool by, for example, extrusion or cast molding to create a replica of the structured surface of the replication tool. In preferred embodiments, the adhesion of the moldable material to the master tool is less than the cohesion at the time of removal of the replica from the master tool. In a specific example, as discussed in more detail in U.S. Pat. No. 5,077,870 (Melbye et al.), a feed stream of a moldable material, such as a thermoplastic resin, is fed into an extruder from which a heated resin melt is fed through a die to a rotating cylindrical replication mold. Alternatively, the moldable material melt may be applied to a planar substrate. Moldable material typically flows into mold cavities, is pressed into tooling molds, and is hardened by cooling and/or curing the moldable material. The moldable material is applied to surface of the master tool substrate until it is at a thickness suitable for the desired replicated article. It may be applied in a uniform thickness or in different thicknesses and configurations, so as to have, for instance, ribs or other structures. Alternatively, a replicated article may be produced by compression molding.

Substantially any moldable material may be used to produce replicated articles using this particular method, or other methods such as those involving casting and/or radiation curing, for example. Preferred moldable materials include thermoplastic resins such as polyolefins (e.g., polypropylene and polyethylene), polyurethane, polyvinyl chloride (PVC), polyesters, and polyamides (e.g., nylon), and blends and copolymers thereof. Additives such as plasticizers, fillers, pigments, dyes, anti-oxidants, release agents, and the like may also be incorporated into the moldable material or other material used in a replication process.

Preferably, the replicated article is removed from the replication tool after the moldable material has hardened so as to maintain the integrity of the geometric structures. Geometric structures similar to, or mirror images of, the cavities and geometric structures in the replication tool protrude from the surface of replicated article. Alternatively, the replicated article may be removed from the replication tool prior to complete hardening of moldable material to produce other desired shapes and properties. If desired, the geometric structures in the replicated article may be subjected to post-processing steps to achieve varied configurations, such as bent over hooks, mushroom-type caps, or other shapes. Furthermore, the surface of a replicated article can be treated, chemically and/or physically, to adjust the surface characteristics. For example, the surface of a replicated article can be treated with a fluorocarbon prior to further replication if desired.

Articles replicated from the replication tool may be used in a wide variety of applications. For instance, the replicated articles may be used as non-wetting surfaces, liquid transfer surfaces, anti-ice surfaces, aerosol delivery devices, anti-soiling surfaces, etc.

Objects and advantages of this invention are further illustrated by the following examples, but the particular materials and amounts thereof recited in these examples, as well as other conditions and details, should not be construed to unduly limit this invention.

EXAMPLES

Example 1

Nickel Chemical Vapor Deposition

The nickel chemical deposition was conducted by the decomposition of $Ni(CO)_4$, with the Mond process (L. Mond, *J. Chem. Soc.*, 57, 749, (1890), and H. E. Carlton and J. H. Oxley, *A. I. Ch. E. Journal*, 13, 86, (1967)). The temperature was controlled in a range of 290° F. (143° C.) to 395° F. (202° C.) to have a reasonable deposition rate. The concentration of nickel carbonyl and the diluent were controlled by flowing rates. The ratio of the diluent, carbon monoxide, to $Ni(CO)_4$ was in a range of 200:1 to 1:1. A 22 inch×11 inch×056 inch (56 cm×28 cm×0.14 cm) mother tool mandrel was fabricated with nickel. The deposited nickel was then separated from the mandrel. The separated nickel has a surface structure shown in FIGS. 1 and 2.

Figure 5:
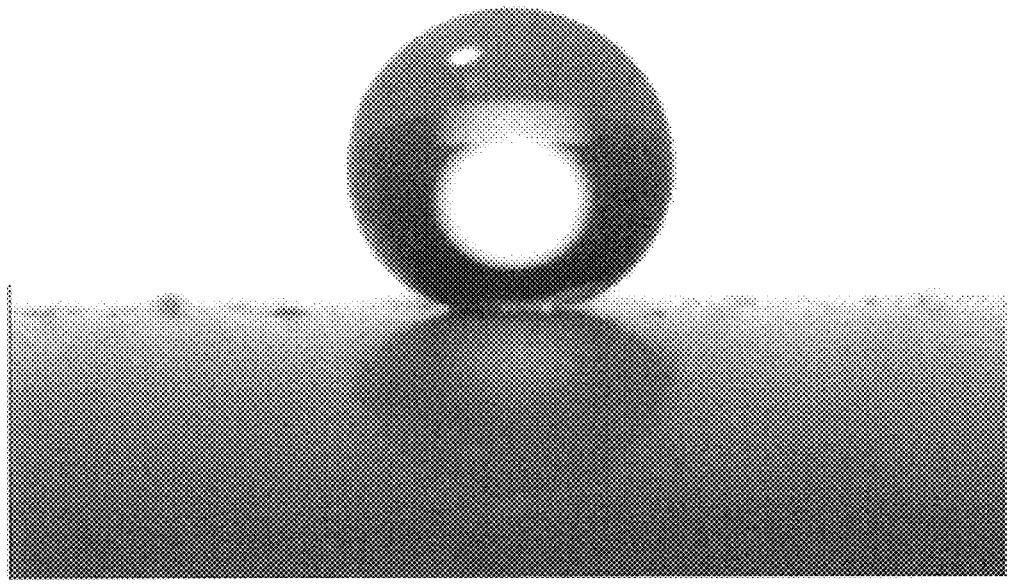
FIG. 5 is a micrograph of a 1.5 microliter droplet of water on a structured surface of the present invention.

A thin layer of 0.1% ester of benzotriazole-5-carboxylic acid and 1H, 1H, 2H, 2H-perfluorododecyl alcohol, hereafter abbreviated as $R_f$-BTA, in ethyl acetate was applied on the structured surface. After the solvent was evaporated, the sample was put into an oven and heated at 300° F. (149° C.) for 0.5 hour. This process coated a hydrophobic layer on the surface. The contact angle was then measured. As shown in Table 1, the advancing angle was 171° and receding angle was 163°. FIG. 5 is a picture (e.g., electron micrograph) of 1.5 microliter (µl) water droplet on this surface.

As a comparatison, an electroformed nickel sample with no surface structure was coated with the hydrophobic layer, $R_f$-BTA, using the same process as above. The advancing contact angle was 123° and receding angle was 39°. This example shows that although the organic coating makes the nickel surface hydrophobic, it is the surface structure that makes the surface extremely hydrophobic.

TABLE 1

| Surface | Contact Angles | |
|---|---|---|
| | Advancing $H_2O$ | Receding $H_2O$ |
| Ni(CVD)/$R_f$-BTA | 171 | 163 |
| Ni(no structure)/$R_f$-BTA | 123 | 39 |
| Ni(negative)/$R_f$-BTA | 164 | 141 |
| Silicone (negative) | 163 | 138 |
| Silicone (positive) | 172 | 163 |
| Silicone (no surface structure) | 113 | 87 |
| PP (negative) | 148 | 91 |
| PP (no surface structure) | 86 | 64 |

Example 2

Electroforming Replication of Nickel

The tool of Example 1 was used to make a replication by nickel electroforming in a nickel sulfamate bath. The composition of the bath was as follows: nickel sulfamate 600 grams/liter (g/L), boric acid 30 g/L, and sodium dodecyl sulfate 0.3 g/L. The pH of the solution was 4.0. Sulfur-depolarized nickel pellets were used as the anode. The temperature of the electroforming was 135° F. (57° C.). The deposited layer of nickel was separated from chemically deposited nickel to obtain the nickel negative replica. Then, the surface of the electroformed nickel was coated with $R_f$-BTA with the same process as mentioned in Example 1. The advancing contact angle was 164° and receding angle was 141°.

Example 3

Silicone Replica

Figure 6:
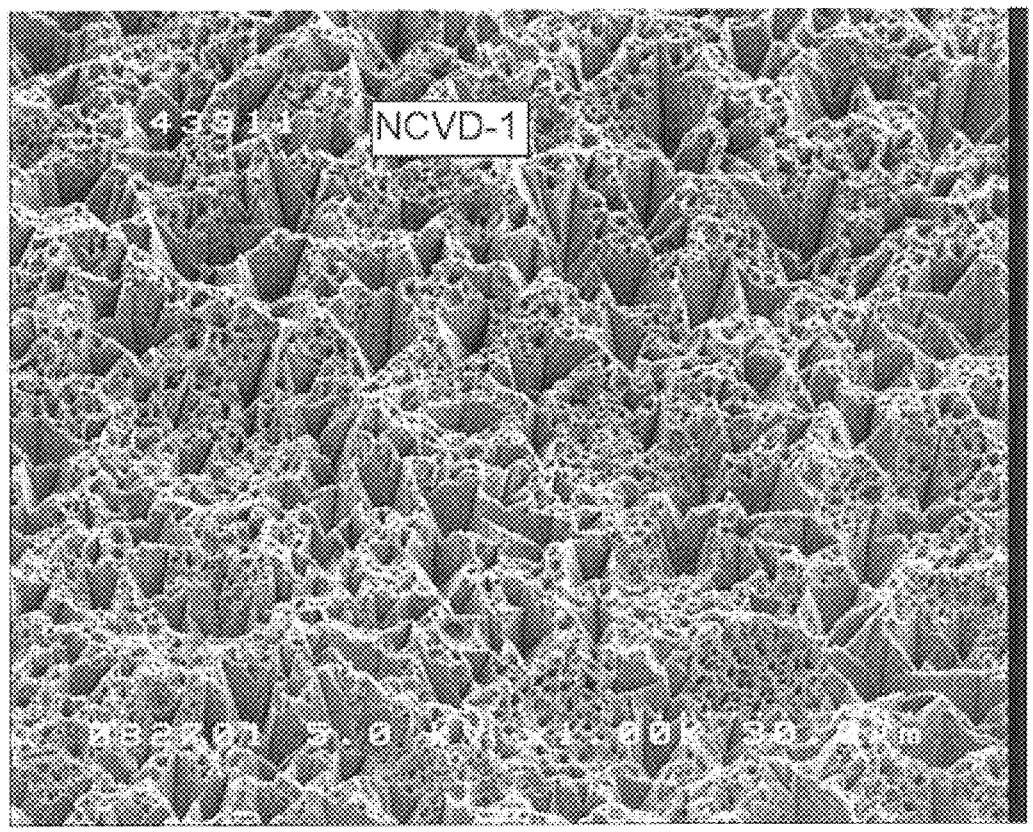
FIG. 6 is a scanning electron micrograph at 1000× magnification of the negative surface of a silicone replica.

Using the deposited nickel as described in Example 1 as a tool, a replica was made using silicone elastomer available under the trade designation SYLGARD 184 from Dow Corning, Midland, Mich., with a ratio of part A to part B of 10:1. The silicone was poured on the tool surface with a dam made of silicone rubber, vacuumed to remove bubbles before it was cured, then heated to 300° F. (149° C.) for one hour. After the silicone was cured, it was separated from the tool to obtain the negatively patterned replica. FIG. 6 shows the SEM picture of the silicone replica. The advancing contact angle was 163° and the receding angle was 138°.

Figure 7:
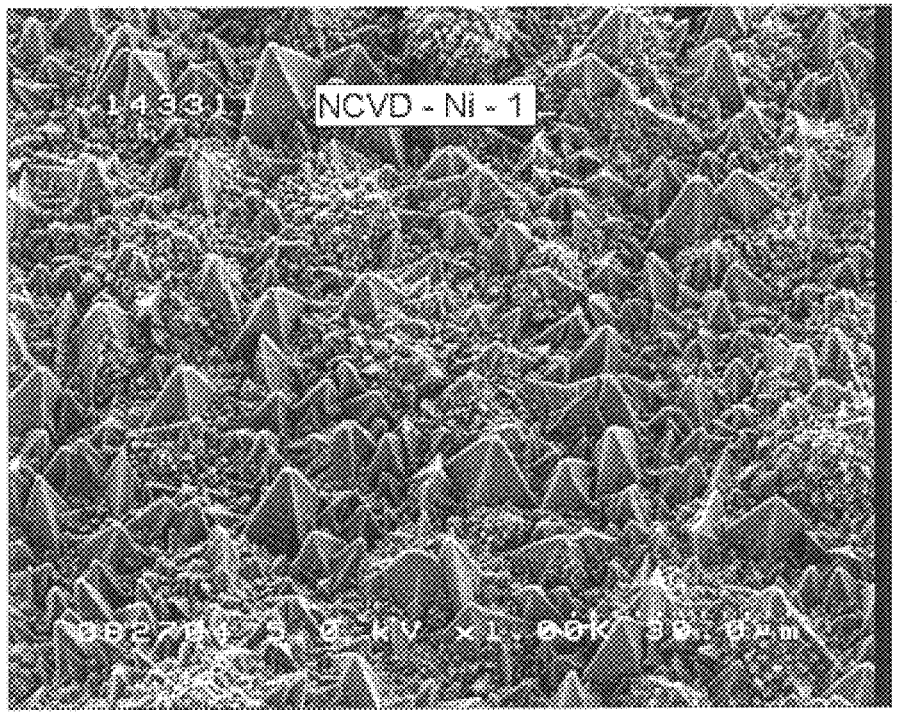
FIG. 7 is a scanning electron micrograph at 1000× magnification of the positive surface of the silicone replica shown in FIG. 6.

With the negative nickel replica made in Example 2 as a tool, the same process was used to obtain a positive silicone replica. FIG. 7 shows the surface structure. FIG. 6 is the negative surface structure. The advancing contact angle of the positive replica was 172° and receding angle was 163°.

As a comparison, a silicone sample was made with the same process but on a nickel sample that had no surface structure. The advancing contact angle was 113° and receding angle was 87°.

Example 4

Polypropylene Replica

Figure 8:
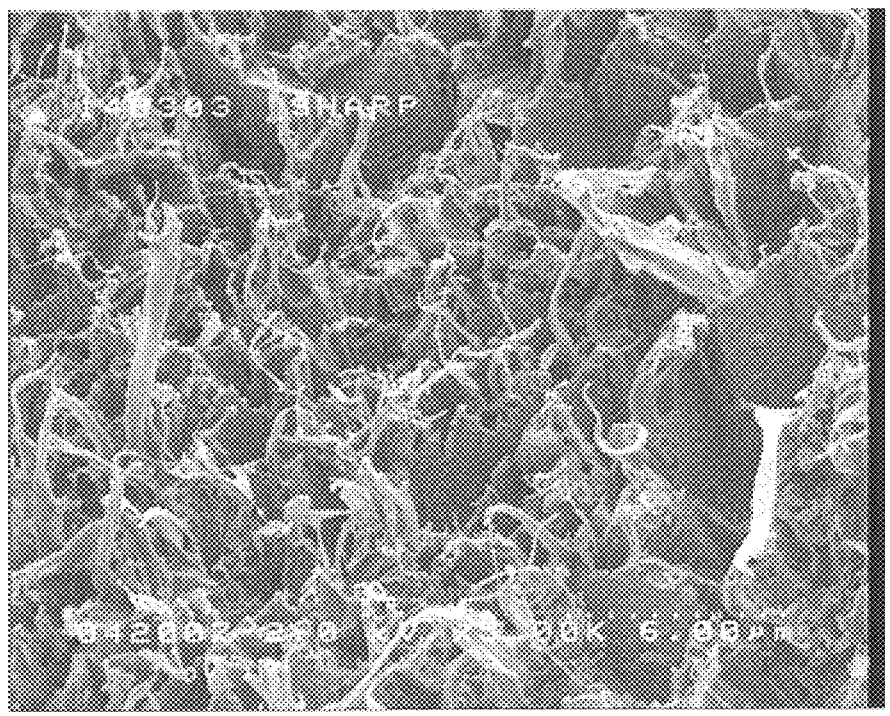
FIG. 8 is a scanning electron micrograph of a deformed replication by polypropylene, which was stretched from the tool to form a structure that is a little different with the original one.

Use the deposited nickel as described in Example 1 as a tool, a replica with polypropylene was made by compression/thermal molding. Polypropylene pellets available under the trade designation EXXON 3445 from Exxon Mobil Corporation, Irving, Tex., were used. The temperature was 355° F. (179° C.) and pressure 1000 pound/square inch (703 ton/square meter). The polypropylene then was separated from the substrate. A deformed "replica" was obtained, as shown in FIG. 8. This deformation is due to the stretch of the polypropylene during the separation. It also shows that the structure is randomly positioned and substantially covering the surface, wherein the structures exhibit a substantially continuous distribution of sizes that range from a minimum size to a maximum size, the minimum size being at most 100 nm and the maximum size being at least 1 micron. The advancing contact angle was 148° and receding angle was 910°.

As a control, the same polypropylene material was used for another compression/thermal molding experiment. The polymer pellets were put between two pieces of polyester sheet so that the replica had no surface structure. The same conditions were adopted for the compression/thermal molding process. The advancing contact angle was 86° and the receding angle was 64°.

Example 5

Water Dipping Test

The high hydrophobic property of the material is also shown by the fact that the material can be dipped into water but the surface is not wetted with water. An experiment was performed in the following way: a piece of polypropylene film having a size of 1 inch×8 inches (2.54 cm×20.3 cm), with surface structure as described in Example 4, was dipped into a 600 milliliter (ml) beaker that contained 500 ml distilled water. A portion of the sample (4.5 inches (11.4 cm)) was dipped in water. It has been observed that there was a layer of air that separated the polymer from water. After 24 hours, the sample was taken out of the beaker. No water was stuck on the surface of the sample.

As a comparison, the back side of the polypropylene sample of Example 4, which had no structure, was dipped into the same amount of water for 24 hours. Water stayed on this side.

Example 6

Cellulose Acetate Replica

Three layers of 2-mil thick cellulose acetate film was dissolved and cast on the surface of the nickel described in Example 1. Acetone was used as the solvent. The solvent was evaporated at room temperature for 4 hours and then the cellulose acetate film was separated from the nickel. The receding contact angle was 0°. In other words, water wet the structured surface very well at the area where the water dropped.

The same experiment was conducted but with the nickel tool described in Example 2 to obtain a negative pattern. The receding contact angle is also 0°.

As a comparison, the cellulose acetate was cast on a smooth nickel surface with no structure using the same procedure. The receding contact angle was 27°. This example indicates that the surface structure improves the wetting for a material that has relatively small contact angle.

Example 7

Low Density Polyethylene Replica

A low density polyethylene sheet available under the trade designation TENITE 1550 from Eastman Chemical Company, Kingsport, Tenn., with 0.5 weight percent of octylphenoxypolyethoxyethanol nonionic surfactant available from Union Carbide, Danbury, Conn., was compression molded on a nickel tool as described in Example 1 to obtain a negative patterned structure. The advancing and receding angles were both 0°.

The contact angle of the same sheet without any surface structure, but with surfactant, was measured. The advancing angle was 11°. The receding angle was 0°. This example illustrates that the surface structure enhanced the hydrophilic property of the surface.

The complete disclosures of the patents, patent documents, and publications cited herein are incorporated by reference in their entirety as if each were individually incorporated. Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A method of replicating a structured surface comprising the steps of:
   providing a tool comprising a structured surface characterized by a plurality of pyramidal shaped structures exhibiting a continuous distribution of sizes ranging from less than 50 nm to greater than 1 micron; and
   replicating the structured surface of the tool into a material to form an article having a surface that replicates the structured surface of the tool, the replicated surface having enhanced hydrophilic properties relative to a surface of an article formed by replicating the same material from an otherwise similar tool having no surface structure.

2. The method of claim 1 further comprising separating the tool comprising a structured surface from the article replicated therefrom.

3. The method of claim 1, wherein the structured surface of the tool comprising a structured surface comprises a crystallized vapor deposited material.

4. The method of claim 3, wherein the crystallized vapor deposited material comprises a metal.

5. The method of claim 1, wherein the structured surface of the tool comprising a structured surface comprises a replica of a crystallized vapor deposited material.

6. The method of claim 1, wherein providing a tool comprising a structured surface comprises the steps of:
   providing a substrate comprising a surface; and
   depositing a material on the surface of the substrate using a vapor deposition technique to form a tool comprising a structured surface.

7. The method of claim 6, wherein the vapor deposition technique is a chemical vapor deposition technique.

8. The method of claim 6, wherein the vapor deposition technique is a physical vapor deposition technique.

9. The method of claim 1, wherein providing a tool comprising a structured surface comprises the steps of:
   providing a substrate comprising a surface;
   depositing a material on the surface of the substrate using a vapor deposition technique to form a crystallized vapor deposited material; and
   separating the crystallized vapor deposited material from the substrate surface to form a tool comprising a structured surface.

10. The method of claim 1, wherein replicating comprises casting a curable composition on a tool and at least partially curing the composition on the surface of the tool.

11. The method of claim 1 further comprising using the replicated surface of the article as a tool for further replication.

12. A method of replicating a structured surface comprising the steps of:
   providing a tool comprising a structured surface characterized by a plurality of pyramidal shaped structures exhibiting a continuous distribution of sizes ranging from less than 50 nm to greater than 1 micron; and
   replicating the structured surface of the tool into a material to form an article having a surface that replicates the structured surface of the tool, the replicated surface having enhanced hydrophobic properties relative to a surface of an article formed by replicating the same material from an otherwise similar tool having no surface structure.

13. The method of claim 1 or 12 wherein replicating comprises embossing the article with the structured surface of the tool.

14. The method of claim 1 or 12 wherein replicating comprises injection molding a polymeric material onto t surface of the tool.

15. The method of claim 1 or 12 wherein replicating comprises extruding a material onto the structured surface of the tool and hardening the material on the tool.

16. The method of claim 1 or 12 wherein replicating comprises electroforming a material onto the structured surface of the tool.

17. The method of claim 1 or 12 wherein replicating comprises vapor depositing a second material onto the structured surface of the tool.

18. A method of increasing the hydrophobicity of a surface, the method comprising:

provinding a tool comprising a structured surface characterized by a plurality of pyramidal shaped structures exhibiting a continuous distribution of sizes ranging from less than 50 nm to greater than 1 micron;

providing an article having a hydrophobic surface;

replicating the structured surface of the tool in the hydrophobic surface to form a replicated article; and separating the tool and the replicated article, wherein the hydrophobicity of the hydrophobic surface of the replicated article is increased.

19. A method of increasing the hydrophilicity of a surface, the method comprising:

providing a tool comprising a structured surface characterized by a plurality of pyramidal shaped structures exhibiting a continuous distribution of sizes ranging from less than 50 nm to greater than 1 micron;

providing an article having a hydrophilic surface;

replicating the structured surface of the tool in the hydrophobic surface to form a replicated article; and separating the tool and the replicated article, wherein the hydrophilicity of the hydrophilic surface of the replicated article is increased.

* * * * *